(12) United States Patent
Fukushima et al.

(10) Patent No.: US 10,354,899 B2
(45) Date of Patent: Jul. 16, 2019

(54) WAFER TRANSFER METHOD AND WAFER TRANSFER DEVICE

(71) Applicant: KAWASAKI JUKOGYO KABUSHIKI KAISHA, Kobe-shi, Hyogo (JP)

(72) Inventors: Takayuki Fukushima, Takarazuka (JP); Ryosuke Kanamaru, Kakogawa (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 330 days.

(21) Appl. No.: 15/518,092

(22) PCT Filed: Oct. 10, 2014

(86) PCT No.: PCT/JP2014/005162
§ 371 (c)(1),
(2) Date: Apr. 10, 2017

(87) PCT Pub. No.: WO2016/056041
PCT Pub. Date: Apr. 14, 2016

(65) Prior Publication Data
US 2018/0254210 A1      Sep. 6, 2018

(51) Int. Cl.
*H01L 21/677* (2006.01)
*B25J 9/16* (2006.01)
(Continued)

(52) U.S. Cl.
CPC ...... *H01L 21/67718* (2013.01); *B25J 9/1664* (2013.01); *B25J 15/00* (2013.01);
(Continued)

(58) Field of Classification Search
None
See application file for complete search history.

(56) References Cited

U.S. PATENT DOCUMENTS

2015/0357213 A1* 12/2015 Yokoyama ........ H01L 21/67086
438/747
2019/0067075 A1* 2/2019 Fukushima .............. B25J 15/08

FOREIGN PATENT DOCUMENTS

JP    H06-252240 A        9/1994
JP     10209243 A    *   8/1998
(Continued)

OTHER PUBLICATIONS

Dec. 16, 2014 International Search Report issued in International Patent Application No. PCT/JP2014/005162.
(Continued)

*Primary Examiner* — Gerald McClain
(74) *Attorney, Agent, or Firm* — Oliff PLC

(57) ABSTRACT

A wafer transfer method which transfers a wafer with a disc shape to a groove for vertically placing the wafer therein, by use of a wafer holding hand, includes causing the wafer holding hand to hold the wafer at at least three support points on an edge of the wafer; moving the wafer holding hand holding the wafer to cause the wafer with a vertical posture in which the wafer is vertically oriented to be positioned above the groove for vertically placing the wafer therein; causing the wafer holding hand to cease to hold the wafer and to support the wafer at two support points on the wedge of the wafer; and moving the wafer holding hand supporting the wafer downward until the edge of the wafer moves into the groove for vertically placing the wafer therein.

9 Claims, 7 Drawing Sheets

(51) Int. Cl.
    *B25J 15/00*        (2006.01)
    *H01L 21/687*       (2006.01)
(52) U.S. Cl.
    CPC ...... *H01L 21/677* (2013.01); *H01L 21/67778* (2013.01); *H01L 21/68707* (2013.01)

(56)            References Cited

FOREIGN PATENT DOCUMENTS

| JP | H10-209243 A   |   | 8/1998 |              |
|----|----------------|---|--------|--------------|
| JP | 2000-260858 A  |   | 9/2000 |              |
| JP | 2002141405 A   | * | 5/2002 |              |
| JP | 2010-165998 A  |   | 7/2010 |              |
| JP | 2017152639 A   | * | 8/2017 | ...... B25J 15/08 |
| JP | 2018125388 A   | * | 8/2018 |              |

OTHER PUBLICATIONS

Apr. 11, 2017 International Preliminary Report on Patentability issued in International Patent Application No. PCT/JP2014/005162.

* cited by examiner

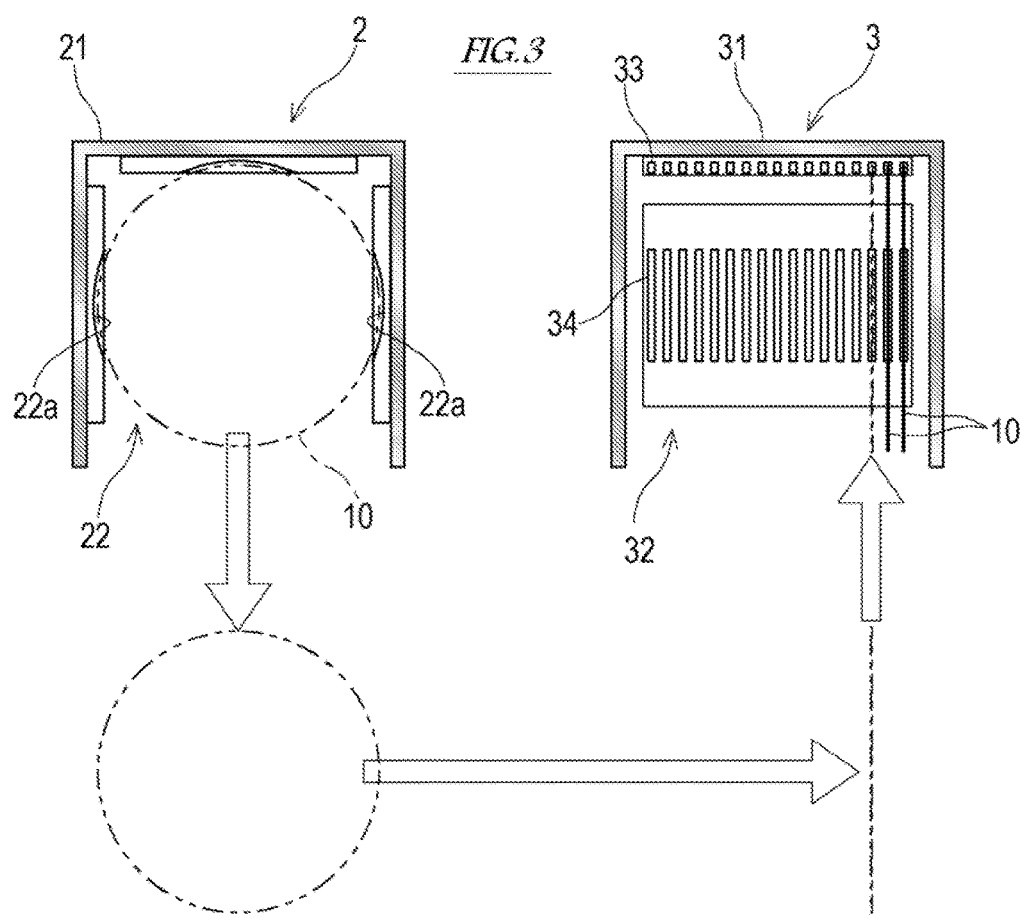

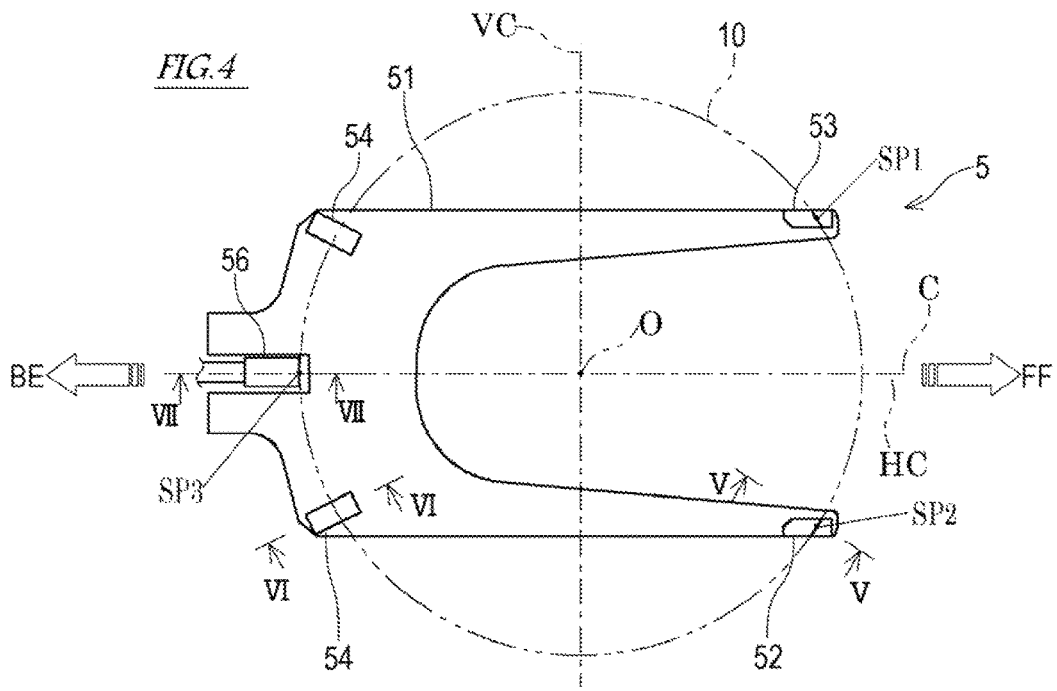
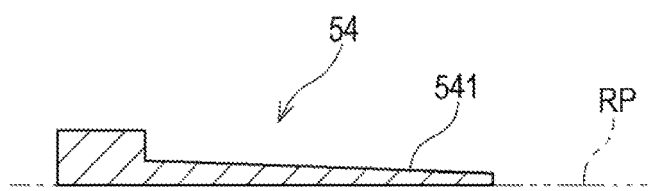
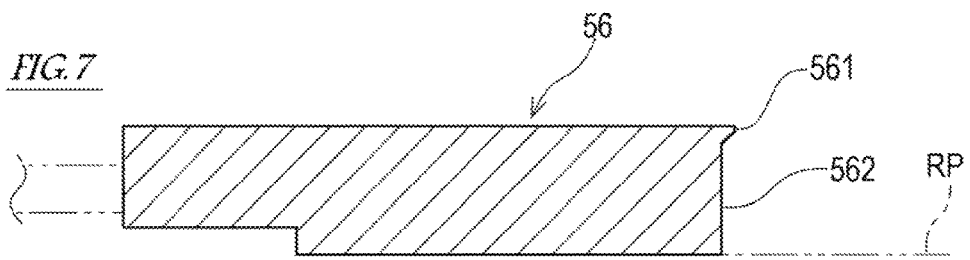

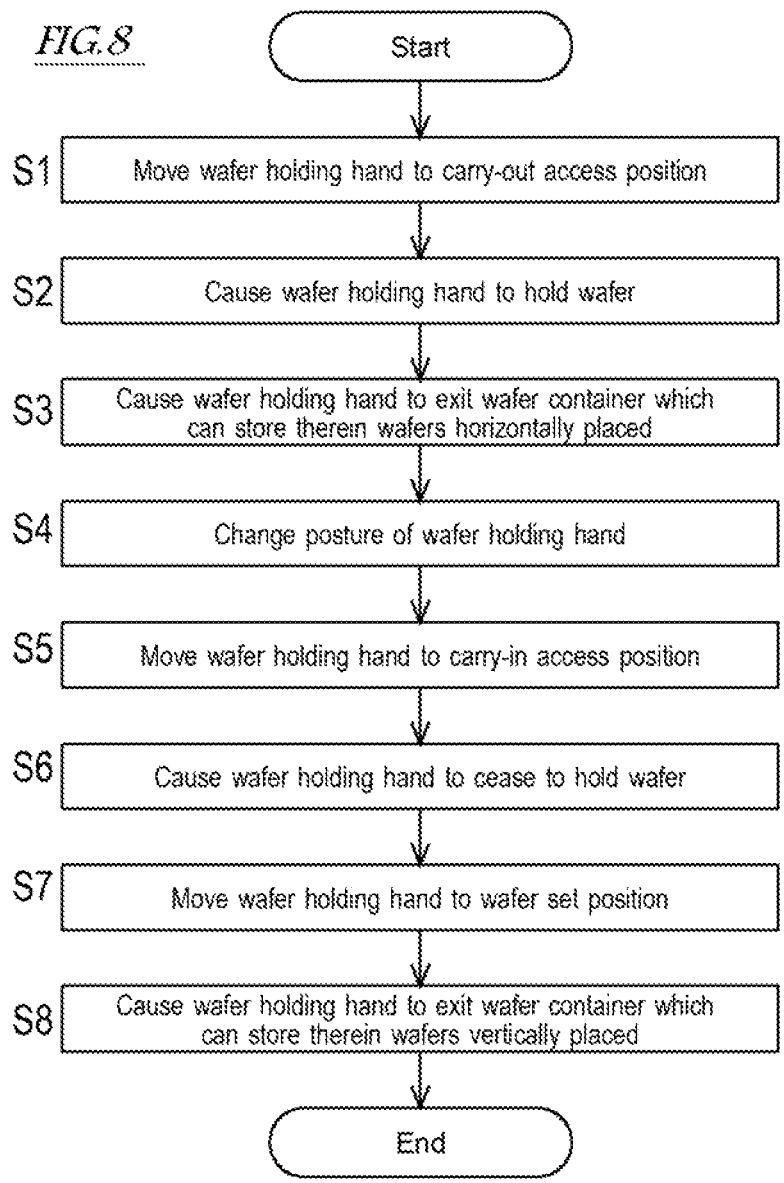

WAFER TRANSFER METHOD AND WAFER TRANSFER DEVICE

TECHNICAL FIELD

The present invention relates to a wafer transfer device including a wafer holding hand which holds the peripheral edge portion of a wafer with a disc shape, and a wafer transfer method using this wafer transfer device.

BACKGROUND ART

Conventionally, a wafer transfer device is known, which includes a hand which holds the peripheral edge portion of a wafer which is a substrate material of a semiconductor device, and a robot body on which this hand is attached. As this kind of wafer transfer device, for example, Patent Literatures 1 and 2 disclose a wafer transfer device configured to transfer the wafer with a vertical posture in which the wafer is vertically oriented. The term "vertical posture" means that the primary (main) surface of the wafer faces substantially horizontally.

Patent Literature 1 discloses a wafer transfer hand including a fixed element disposed below the wafer, a movable element which is disposed above the wafer and is advanceable to and retractable from the wafer, and a frame on which these elements are attached. This wafer transfer hand is configured to hold the peripheral edge portion of the wafer with the vertical posture, by use of the fixed element and the movable element.

Patent Literature 2 discloses a wafer holding device including two front-side (near-side) pads disposed at a front side of the wafer and at upper and lower sides in such a manner that a horizontal line extending through the center of the wafer is interposed between the two pads, a back-side (far-side) pad disposed at a back side of the wafer and above the horizontal line extending through the center of the wafer, and an end effector having a tip end on which the back-side pad is attached.

Patent Literature 2 further discloses a wafer container which can store therein a plurality of wafers in a state in which the wafers have a vertical posture and are horizontally arranged with predetermined gaps. In the interior of this wafer container, a plurality of V-shaped grooves which are horizontally arranged with predetermined gaps are provided in a back wall and a floor. The peripheral edge portion of each of the plurality of wafers is fitted into the groove of the back wall and the groove of the floor. In this way, the wafer is held in the wafer container which can store therein the wafers vertically placed.

CITATION LIST

Patent Literature

Patent Literature 1: Japanese-Laid Open Patent Application Publication No. 2000-260858
Patent Literature 2: Japanese-Laid Open Patent Application Publication No. 2010-165998

SUMMARY OF INVENTION

Technical Problem

In the wafer holding hand (the wafer transfer hand disclosed in Patent Literature 1 and the wafer holding device disclosed in Patent Literature 2) which holds the peripheral edge portions of the wafers, which is disclosed in Patent Literature 1, 2, to stably hold the wafer with the vertical posture, the pads and the elements which contact the wafer are formed with U-shaped or V-shaped grooves. The wafer is restricted by the wafer holding hand in such a manner that the peripheral edge portion of the wafer is fitted into the grooves of the pads and the grooves of the elements, and the wafer is pressurized by the pads and the elements in an inward direction.

In a case where the wafer is placed in the groove for vertically placing the wafer therein (e.g., the back wall groove and the floor groove), of the wafer container which stores therein the wafers vertically placed, by use of the wafer holding hand as described above, there may be a slight error between a target position at which the wafer is to be placed, which is taught to the wafer holding hand, and an actual position of the groove for vertically placing the wafer therein. Such an error is attributed to, for example, a processing accuracy error of the groove. In a case where the wafer restricted by the wafer holding hand is transferred to the target position in a state in which there is an error between the position of the groove and the target position, the wafer strongly contacts the inner wall or the like of the container or a strong friction between the wafer and the inner wall or the like occurs, which may cause particles.

Solution to Problem

The above-described particles generated in the transfer step of the wafer are undesirable, because they adhere to and contaminate the wafer. To solve such a problem, the inventors conceived that the wafer is transferred to the target position at which the wafer is to be placed, while permitting a movement (displacement) of the wafer with respect to the wafer holding hand. If a movement of the wafer with respect to the wafer holding hand is permitted, the wafer moves by itself to the groove and absorbs an error between the position of the groove and the target position, while preventing a situation in which the wafer strongly contacts the inner wall of the container or a strong friction between the wafer and the inner wall occurs.

According to an aspect of the present invention, there is provided a wafer transfer method which transfers a wafer with a disc shape to a groove for vertically placing the wafer therein, by use of a wafer holding hand, the wafer transfer method comprising: causing the wafer holding hand to hold the wafer at at least three support points on an edge of the wafer; moving the wafer holding hand holding the wafer to cause the wafer with a vertical posture in which the wafer is vertically oriented to be positioned above the groove for vertically placing the wafer therein; causing the wafer holding hand to cease to hold the wafer and to support the wafer at two support points on the wedge of the wafer; and moving the wafer holding hand supporting the wafer downward until the edge of the wafer moves into the groove for vertically placing the wafer therein.

In the above wafer transfer method, preferably, in a case where a region that is above a horizontal center line extending through a center of the wafer with the vertical posture is an upper side, a region that is below the horizontal center line is a lower side, a region that is on one side of a vertical center line extending through the center of the wafer with the vertical posture is a first side, and a region that is on the other side of the vertical center line is a second side, the at least three support points at which the wafer is held by the wafer holding hand include: an upper support point located on the edge of the wafer that is on the first side and on the upper side; a lower support point located on the edge of the wafer that is on the first side and on the lower side; and an intermediate support point located on the edge of the wafer that is on the second side and between the upper support point and the lower support point in a vertical direction.

Preferably, in the above wafer transfer method, the two support points at which the wafer is supported on the wafer holding hand may include: the lower support point located on the edge of the wafer that is on the first side and on the lower side; and an upper support point located on the wedge of the wafer that is on the second side and above the lower support point.

In accordance with the above-described wafer transfer method, since the wafer with the vertical posture is held by the wafer holding hand at the three support points while the wafer is transferred to a position that is above the groove for vertically placing the wafer therein, the wafer can be stably transferred to the groove. At a time point when the wafer is placed in the groove for vertically placing the wafer therein, the wafer is supported on the wafer holding hand at the two support points. Therefore, a movement of the wafer with respect to the wafer holding hand is permitted. Therefore, when the edge of the wafer moves into the groove for vertically placing the wafer therein, the wafer moves by itself to the bottom of the groove while preventing a situation in which the wafer strongly contacts the inner wall of the groove or other regions, or a strong friction between the wafer and the inner wall of the groove or other regions occurs, and thus the wafer is placed in the groove. In brief, even in a case where there is an error between the target position at which the wafer is to be placed, and the position of the groove for vertically placing the wafer therein, this error is absorbed by the movement of the wafer with respect to the wafer holding hand.

In the above wafer transfer method, the wafer held by the wafer holding hand may have a horizontal posture in which the wafer is horizontally oriented, and moving the wafer holding hand holding the wafer may include rotating the waver holding hand to cause the wafer to have the vertical posture.

In accordance with this transfer method, the wafer with the horizontal posture can be transferred to the groove for vertically placing the wafer therein.

According to another aspect of the present invention, there is provided a wafer transfer method which transfers a wafer to a groove for vertically placing the wafer therein, by use of a wafer holding hand including an upper pad, a lower pad, and an intermediate movable pad, wherein in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, the upper pad is configured to contact the edge of the wafer that is on the first side and on the upper side, the lower pad is configured to contact the edge of the wafer that is on the first side and on the lower side, and the intermediate movable pad is configured to contact the edge of the wafer that is on the second side and between the upper pad and the lower pad in a vertical direction, the wafer transfer method comprising: causing the wafer holding hand to hold the wafer by the upper pad, the lower pad, and the intermediate movable pad; moving the wafer holding hand holding the wafer to cause the wafer with the vertical posture to be positioned above the groove for vertically placing the wafer therein; causing the intermediate movable pad of the wafer holding hand to be retracted from the edge of the wafer to support the wafer by the lower pad and the intermediate movable pad of the wafer holding hand; and moving the wafer holding hand supporting the wafer downward until the edge of the wafer moves into the groove for vertically placing the wafer therein.

According to a further aspect of the present invention, there is provided a wafer transfer method which transfers a wafer to a groove for vertically placing the wafer therein, by use of a wafer holding hand including an upper pad, a lower pad, an intermediate fixed pad, and an intermediate movable pad, wherein in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, the upper pad is configured to contact the edge of the wafer that is on the first side and on the upper side, the lower pad is configured to contact the edge of the wafer that is on the first side and on the lower side, the intermediate fixed pad is configured to contact the edge of the wafer that is on the second side and between the upper pad and the lower pad in a vertical direction, and the intermediate movable pad is configured to contact the edge of the wafer that is on the second side and between the upper pad and the lower pad in the vertical direction, the wafer transfer method comprising: causing the wafer holding hand to hold the wafer by the upper pad, the lower pad, and the intermediate movable pad; moving the wafer holding hand holding the wafer to cause the wafer with the vertical posture to be positioned above the groove for vertically placing the wafer therein; causing the intermediate movable pad of the wafer holding hand to be retracted from the edge of the wafer to support the wafer by the lower pad and the intermediate fixed pad of the wafer holding hand; and moving the wafer holding hand supporting the wafer downward until the edge of the wafer moves into the groove for vertically placing the wafer therein.

According to an aspect of the present invention, there is provided a wafer transfer device which transfers a wafer with a disc shape to a groove for vertically placing the wafer therein, the wafer transfer device comprising: in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, a wafer holding hand including an upper pad configured to contact the edge of the wafer that is on the first side and on the upper side; a lower pad configured to contact the edge of the wafer that is on the first side and on the lower side; an intermediate movable pad configured to contact the edge of the wafer that is on the second side and between the upper pad and the lower pad in a vertical direction; and an actuator which advances the intermediate movable pad toward the wafer and retracts the intermediate movable pad from the wafer; a robot body on which the wafer holding hand is attached; and a controller which controls the robot body and the actuator to perform: an operation for advancing the intermediate movable pad of the wafer holding hand to cause the wafer holding hand to hold the wafer by the upper pad, the lower pad, and the intermediate movable pad, an operation for moving the wafer holding hand holding the wafer to cause the wafer with the vertical posture to be positioned above the groove for vertically placing the wafer therein; an operation for causing the intermediate movable pad of the wafer holding hand to be retracted from the edge of the wafer to support the wafer by the lower pad and the intermediate movable pad of the wafer holding hand; and an operation for moving the wafer holding hand supporting the wafer downward until the edge of the wafer moves into the groove for vertically placing the wafer therein.

According to another aspect of the present invention, there is provided a wafer transfer device which transfers a wafer with a disc shape to a groove for vertically placing the wafer therein, the wafer transfer device comprising: in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, a wafer holding hand including an upper pad configured to contact the edge of the wafer that is on the first side and on the upper side; a lower pad configured to contact the edge of the wafer that is on the first side and on the lower side; an intermediate fixed pad configured to contact the edge of the wafer that is on the second side and between the upper pad and the lower pad in a vertical direction, an intermediate movable pad configured to contact the edge of the wafer that is on the second side and between the upper pad and the lower pad in the vertical direction; and an actuator which advances the intermediate movable pad toward the wafer and retracts the intermediate movable pad from the wafer; a robot body on which the wafer holding hand is attached; and a controller which controls the robot body and the actuator to perform: an operation for advancing the intermediate movable pad of the wafer holding hand to cause the wafer holding hand to hold the wafer by the upper pad, the lower pad, and the intermediate movable pad, an operation for moving the wafer holding hand holding the wafer to cause the wafer with the vertical posture to be positioned above the groove for vertically placing the wafer therein; an operation for causing the intermediate movable pad of the wafer holding hand to be retracted from the edge of the wafer to support the wafer by the lower pad and the intermediate fixed pad of the wafer holding hand; and an operation for moving the wafer holding hand supporting the wafer downward until the edge of the wafer moves into the groove for vertically placing the wafer therein.

In the wafer transfer method according to another aspect of the present invention, the wafer transfer method according to further aspect of the present invention, the wafer transfer device according to the aspect of the present invention, and the wafer transfer device according to another aspect of the present invention, since the wafer with the vertical posture is held by the wafer holding hand at the three support points while the wafer is transferred to a position that is above the groove for vertically placing the wafer therein, the wafer can be stably transferred to the groove. At a time point when the wafer is placed in the groove for vertically placing the wafer therein, the wafer is supported on the wafer holding hand at the two support points. Therefore, a movement of the wafer with respect to the wafer holding hand is permitted. Therefore, when the edge of the wafer moves into the groove for vertically placing the wafer therein, the wafer moves by itself to the bottom of the groove while preventing a situation in which the wafer strongly contacts the inner wall of the groove or other regions, or a strong friction between the wafer and the inner wall of the groove or other regions occurs, and thus the wafer is placed in the groove. In brief, even in a case where there is an error between the target position at which the wafer is to be placed, and the position of the groove for vertically placing the wafer therein, this error is absorbed by the movement of the wafer with respect to the wafer holding hand.

Advantageous Effects of Invention

In accordance with the wafer transfer method and device of the present invention, when the wafer is placed in the groove for vertically placing the wafer therein, the wafer is supported on the wafer holding hand at the two support points, and a movement of the wafer is permitted. Therefore, when the edge of the wafer moves into the groove for vertically placing the wafer therein, the wafer moves by itself to the bottom of the groove while preventing a situation in which the wafer strongly contacts the inner wall of the groove or other regions, or a strong friction between the wafer and the inner wall of the groove or other regions occurs, and thus the wafer is placed in the groove.

BRIEF DESCRIPTION OF DRAWINGS

FIG. 3 is a view showing an example of a wafer container which can store therein a plurality of wafers horizontally placed and a wafer container which can store therein the plurality of wafers vertically placed.

FIG. 4 is a view showing a wafer holding hand holding a wafer.

FIG. 5 is a cross-sectional view taken along line V-V of FIG. 4.

FIG. 6 is a cross-sectional view taken along line VI-VI of FIG. 4.

FIG. 7 is a cross-sectional view taken along line VII-VII of FIG. 4.

FIG. 8 is a flowchart showing a flow of a control of the wafer transfer device, which is performed when the wafer is transferred to a groove for vertically placing the wafer therein.

DESCRIPTION OF EMBODIMENTS

Figure 1:
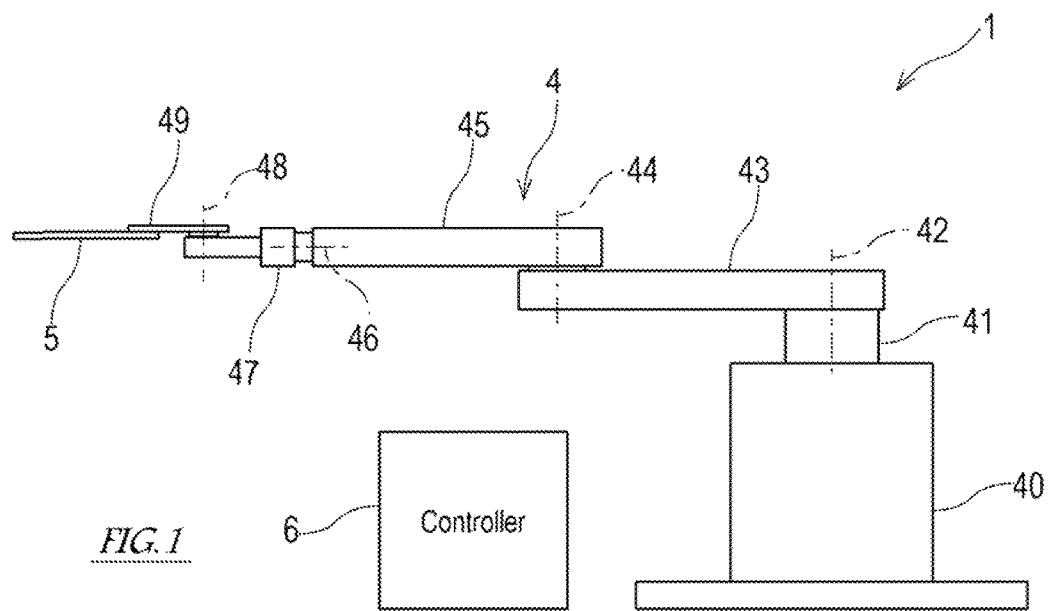
FIG. 1 is a view showing the schematic configuration of a wafer transfer device according to the embodiment of the present invention.
Figure 2:
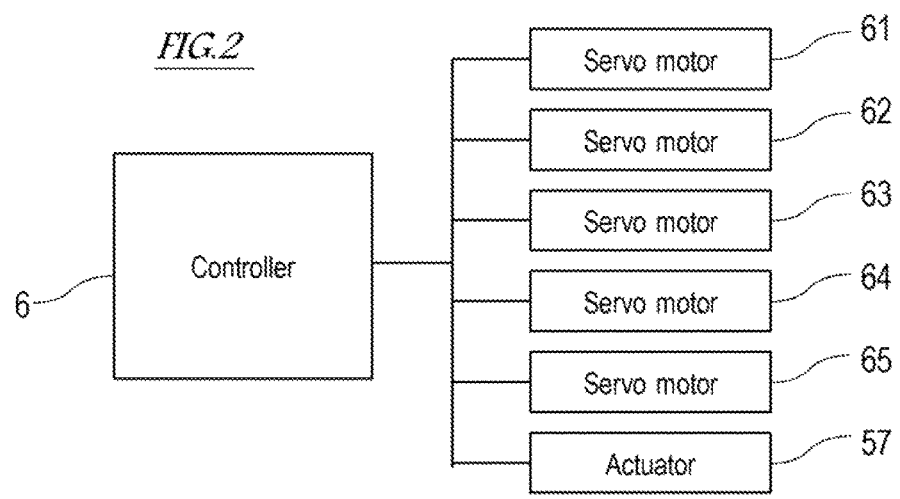
FIG. 2 is a block diagram showing a control configuration of the wafer transfer device.

Now, the embodiment of the present invention will be described with reference to the drawings. FIG. 1 is a view showing the schematic configuration of a wafer transfer device 1 according to the embodiment of the present invention. FIG. 2 is a block diagram showing a control configuration of the wafer transfer device 1. FIG. 3 is a view showing an example of a wafer container 2 which can store therein a plurality of wafers horizontally placed (a plurality of wafers placed in a state in which the wafers are horizontally oriented) and a wafer container 3 which can store therein the plurality of wafers vertically placed (the plurality of wafers placed in a state in which the wafers are vertically oriented), when viewed from above (in a plan view). The wafer transfer device 1 according to the embodiment is configured to transfer a wafer 10 with a disc shape between each of grooves 22 which are provided inside the wafer container 2 to horizontally place the wafers 10 therein, and each of grooves 32 which are provided inside the wafer container 3 to vertically place the wafers 10 therein.

As shown in FIG. 3, the wafer container 2 and the wafer container 3 are carriers intended to transfer, preserve or process the plurality of wafers 10 together (in a collective manner). In the present invention, the wafers 10 are, for example, circular thin plates which become a substrate material of a semiconductor device, such as semiconductor wafers and glass wafers. As examples of the semiconductor wafers, there are silicon wafers, sapphire (monocrystal alumina) wafers, or other kinds of wafers. As examples of the glass wafers, there are glass substrate for FPDs (flat panel displays) or glass substrates for MEMS (micro electro mechanical systems). As treatments performed for the plurality of wafers 10 stored in the wafer container 2 or the wafer container 3, there are process treatments such as a thermal treatment, an impurity implantation treatment, a thin film formation treatment, a lithography treatment, a washing treatment, and a flattening treatment.

The wafer container 2 which can store therein the plurality of wafers 10 horizontally placed includes a box-like shell 21 which opens forward, and an openable/closable door provided at the front side of the shell 21. In the interior of the wafer container 2, plural sets of grooves 22 for horizontally placing the wafers 10 therein, are arranged at vertically equal intervals (e.g., intervals of 5 to 15 mm). The grooves 22 constitute a rack in which the wafers 10 are held to have a horizontal posture (a posture in which the primary surfaces of the wafers 10 are substantially horizontal).

Each of the plural sets of grooves 22 includes a plurality of horizontal grooves 22a (substantially horizontal grooves 22a) which are provided on the inner wall surface of the shell 21 or a region that is in the vicinity of the inner wall surface of the shell 21, and arranged at a vertically equal level. The peripheral edge portion of the wafer 10 is inserted from the front into the plurality of horizontal grooves 22a at the vertically equal level, and thus the wafer 10 is held in the groove 22 in a state in which the wafer 10 has a horizontal posture. Although in the present embodiment, the horizontal grooves 22a are provided at three sides of the periphery of the wafer 10 stored in the container 2, the horizontal grooves 22a may be provided at four sides of the periphery of the wafer 10 stored in the container 2.

The wafer container 3 which can store therein the plurality of wafers 10 vertically placed includes a box-like shell 31 which opens forward, and an openable/closable door (not shown) provided at the front side of the shell 31. In the interior of the wafer container 3, plural rows of grooves 32 for vertically placing the wafers 10 therein, are arranged at substantially equal intervals (e.g., intervals of 5 to 15 mm) in a substantially horizontal direction. The grooves 32 constitute a rack in which the wafers 10 are held to have a vertical posture in which the wafers 10 are vertically oriented.

Each of the plural rows of grooves 32 includes for example, a vertical groove 33 (substantially vertical groove) provided on the inner wall surface at the back (far) side of the shell 31, and a horizontal groove 34 (substantially horizontal groove) provided on the inner bottom surface of the shell 31. Each of the vertical groove 33 and the horizontal groove 34 has a V-shaped cross-section and has two inclined surfaces facing each other with a groove bottom surface between the inclined surfaces. The peripheral edge portion of the wafer 10 is inserted from the front into the corresponding vertical groove 33 and horizontal groove 34, and thus the wafer 10 is held in the groove 32 in a state in which the wafer 10 has the vertical posture.

The interval between the grooves 22 of the container 2 for horizontally placing the wafers 10 therein, and the interval between the grooves 32 of the container 3 for vertically placing the wafers 10 therein may be values according to SEMI standard or other valves. Further, the containers 2, 3 may be provided with an interface connected to a semiconductor manufacturing device (not shown).

As shown in FIGS. 1 and 2, the wafer transfer device 1 includes a robot body 4, a wafer holding hand 5 which is an end effector attached on the robot body 4, and a controller 6 which controls the operation of the wafer transfer device 1. Hereinafter, the constituents of the wafer transfer device 1 will be described in detail.

Initially, the robot body 4 will be described. The robot body 4 of the wafer transfer device 1 according to the present embodiment includes a three-axis horizontal articulated (multi-joint) robot including a rotatable wrist 47. However, the robot body 4 is not limited to the horizontal articulated robot and may include a vertical articulated robot as a base.

The robot body 4 includes a base member 40, an up-down shaft 41 which is vertically extendable and contractible from the base member 40, a first arm 43 coupled to the up-down shaft 41 in such a manner that the first arm 43 is rotatable around a first axis 42 extending through the center axis of the up-down shaft 41, a second arm 45 coupled to the tip end of the first arm 43 in such a manner that the second arm 45 is rotatable around a second axis 44, the wrist 47 coupled to the tip end of the second arm 45 in such a manner that the wrist 47 is rotatable around a third axis 46, and a hand base section 49 coupled to the tip end of the wrist 47 in such a manner that the hand base section 49 is rotatable around a fourth axis 48. The wafer holding hand 5 is attached on the hand base section 49. The first axis 42 and the second axis 44 are vertical axes, respectively, while the third axis 46 is a horizontal axis. The fourth axis 48 is orthogonal to the third axis 46, and extends vertically in a state in which the robot body 4 is in a steady state.

The robot body 4 further includes servo motors 61 to 64 and a driving force transmission mechanism (not shown) as a driving unit which rotates the first arm 43, the second arm 45, the wrist 47, and the hand base section 49 around their axes. The robot body 4 further includes a servo motor 65 and a driving force transmission mechanism (not shown) as a driving unit which extends and contracts the up-down shaft 41 with respect to the base member 40. The servo motors 61 to 65 operate in response to control signals output from the controller 6.

Next, the wafer holding hand 5 will be described. FIG. 4 is a view showing the wafer holding hand 5 holding the wafer 10. The wafer 10 held by the wafer holding hand 5 is indicated by a chain double-dashed line. As shown in FIG. 4, the wafer holding hand 5 has a substantially symmetric shape with respect to a virtual center line C connecting a base end side BE and a tip end side FF to each other. A center O of the wafer 10 held by the wafer holding hand 5 is located on the center line C.

The wafer holding hand 5 includes two pads which are a lower pad 52 and an upper pad 53 which are disposed on both sides of the center line C at the tip end side FF, two guides 54 which are disposed on both sides of the center line C at the base end side BE relative to the two pads 52, 53, a chuck 56 disposed on the center line C at a location between the two guides 54, an actuator 57 which advances and retracts the chuck 56, and a base plate 51 supporting the pads 52, 53, the guides 54, and the chuck 56. The lower pad 52 and the upper pad 53 are fixed pads fixed to the base plate 51. The chuck 56 is an intermediate movable pad which is movable with respect to the base plate 51 and is located between the lower pad 52 and the upper pad 53.

The base plate 51 has a spatular shape which is thin and flat. The base plate 51 has a substantially-Y shape as a whole in which the tip end portion including the center line C has a large hollow space. The base end of the base plate 51 is fastened to the hand base section 49 of the robot body 4 by use of a fastener member. The two pads 52, 53 are fastened to the tip end portion of the base plate 51, and the two guides 54 are fastened to the base portion of the base plate 51.

FIG. 5 is a cross-sectional view taken along line V-V of FIG. 4, showing the cross-sectional shape of one (the lower pad 52) of the two pads 52, 53. Since the two pads 52, 53 have a symmetric shape with respect to the center line C as a symmetric axis, the lower pad 52 will be described, and description of the upper pad 53 is omitted. As shown in FIG. 5, the lower pad 52 includes a tilted surface 521 which is tilted toward the base end side BE with respect to a reference plane RP as the surface of the base plate 51, a vertical surface 522 which is substantially perpendicular to the reference plane RP at the tip end side FF of the tilted surface 521, and a flange 523 provided at the rim of the vertical surface 522. The vertical surface 522 is a location which the edge of the wafer 10 held by the wafer holding hand 5 contacts. The vertical surface 522 is a curved surface conforming in shape (namely, circular-arc shape) to the edge of the wafer 10. The base portion of the vertical surface 522 is continuous with the end portion of the tilted surface 521, at the tip end side FF, namely, the end portion which is apart from the reference plane RP. The flange 523 is a protruding portion provided along the rim of the end portion of the vertical surface 522. The flange 523 functions as a disengagement prevention section for preventing disengagement of the wafer 10.

FIG. 6 is a cross-sectional view taken along line VI-VI of FIG. 4, showing one of the two guides 52. Since the two guides 54 have a symmetric shape with respect to the center line C as a symmetric axis, one of the two guides 54 be described, and description of the other guide 54 is omitted. As shown in FIG. 6, the guide 54 includes a tilted surface 541 which is tilted toward the tip end side FF with respect to the virtual reference plane RP including the surface of the base plate 51.

FIG. 7 is a cross-sectional view taken along line VII-VII of FIG. 4, showing the cross-sectional shape of the chuck 56. The chuck 56 includes a vertical surface 562 which the edge of the wafer 10 contacts, and a flange 561 provided at the end edge of the vertical surface 562. The flange 561 is a protruding portion provided along the rim of the end portion of the chuck 56 which is apart from the reference plane RP. The flange 561 functions as a disengagement prevention section for preventing disengagement of the wafer 10.

The chuck 56 is actuated by the actuator 57 in such a manner that the chuck 56 is movable among a retracted position, a holding ceasing position (position at which the wafer holding hand 5 ceases to hold the wafer 10 and the wafer 10 is released from the restriction, which is advanced from the retracted position toward the tip end side FF, and a holding position which is advanced from the holding ceasing position toward the tip end side FF, along the center line C. The actuator 57 is selected from, for example, a driving force transmission mechanism such as an electric motor and a rack and pinion or a ball screw, a pneumatic cylinder, and a hydraulic cylinder. The operation of the actuator 57 is controlled by the controller 6. The actuator 57 is supported on the hand base section 49 on which the wafer holding hand 5 is attached.

Next, the controller 6 will be described. As shown in FIG. 2, the servo motors 61 to 65, the actuator 57, and sensors which are not shown, are electrically connected to the controller 6. Note that servo amplifiers (not shown) are provided between the controller 6 and the servo motors 61 to 65 to convert control signals from the controller 6 into driving currents and supply the driving currents to the servo motors 61 to 65, respectively. The controller 6 is a computer, and includes CPU, ROM, RAM, I/F, I/O, and the like (these are not shown). The ROM contains therein, programs to be executed by the CPU, fixed data and the like. The programs to be executed by the CPU are stored in storage media such as a flexible disc, a CD-ROM, and a memory card, and are installed into the ROM from these storage media. Data required to execute the programs are temporarily stored in the RAM. The I/F is configured to transmit/receive data to/from an external device. The I/O is configured to receive detection signals as inputs from the sensors and output the control signals. The controller 6 performs processing for controlling the operation of the wafer transfer device 1 in such a manner that software such as the programs stored in the ROM and hardware such as the CPU cooperate with each other. The controller 6 may be a single CPU which performs the processing, a plurality of CPUs, or a combination of the CPU and a particular processing circuit, which performs/perform the processing.

Now, the operation of the wafer transfer device 1 will be described. The wafer transfer device 1 can take the wafer 10 stored in the groove 22 for horizontally placing the wafer 10 therein, out of the wafer container 2 which can store therein the wafer 10 horizontally placed, change the posture of the wafer 10 from a horizontal posture (horizontally oriented state) to a vertical posture (vertically oriented state), and then transfer the wafer 10 to the groove 32 for vertically placing the wafer 10 therein, of the wafer container 3 which can store therein the wafers 10 vertically placed. In addition, the wafer transfer device 1 can take the wafer 10 stored in the groove 32 for vertically placing the wafer 10 therein, out of the wafer container 32 which can store therein the wafers 10 vertically placed, change the posture of the wafer 10 from the vertical posture to the horizontal posture, and then transfer the wafer 10 to the groove 22 of the wafer container 2.

Initially, the operation of the wafer transfer device 1 performed in a case where the wafer 10 stored in the wafer container 2 which can store therein the wafers 10 horizontally placed is transferred to the groove 32 for vertically placing the wafer 10 therein, of the wafer container 3 which can store therein the wafers 10 vertically placed will be described. FIG. 8 is a flowchart showing a flow of a control for the wafer transfer device 1, which is performed when the wafer 10 is transferred to the groove 32. The operation of the wafer transfer device 1 for transferring the wafer 10 is taught to the controller 6 in advance, and a transfer program is created based on this teaching. The controller 6 executes the transfer programs, and thus the wafer transfer device 1 reproduces the operation stored by the teaching.

As shown in FIG. 8, initially, the controller 6 outputs the control signals to the driving unit of the robot body 4 to move the wafer holding hand 5 with a posture in which the reference plane RP is substantially horizontal, to a carry-out access position (step S1). The driving unit of the robot body 4 includes the servo motors 61 to 65, the servo amplifiers which supply electric power to the servo motors 61 to 65, and the like, and the control signals include, for example, position signals and speed signals.

The wafer holding hand 5 placed at the carry-out access position is present immediately below the wafer 10 which is going to be carried out of the wafer container 2. While the wafer holding hand 5 is moving toward the carry-out access position, the wafer holding hand 5 moves to a location that is in front of the wafer container 2, and then moves into a gap formed between the wafer 10 (carry-out target wafer 10) to be carried out of the wafer container 2 and the wafer 10 located immediately below the carry-out target wafer 10 to a location that is immediately below the carry-out target wafer 10. The wafer holding hand 5 located immediately below the carry-out target wafer 10 is positioned so that the edge of the wafer 10 overlaps with the tilted surfaces 521 of the two pads 52, 53 and the tilted surfaces 541 of the two guides 54 in a plan view. Each of the length of the tilted surfaces 521 of the two pads 52, 53, and the length of the tilted surfaces 541 of the two guides 54 is set to a value that is sufficient to absorb a position error between the carry-out target wafer 10 and the wafer holding hand 5. The chuck 56 which is thicker than the pads 52, 53 and the guides 54 is at the retracted position, and is retracted at a sufficient distance from the edge of the wafer 10.

Then, the controller 6 outputs the control signals to the driving unit of the robot body 4 and the actuator 57 to cause the wafer holding hand 5 to hold the wafer 10 (step S2). Specifically, the controller 6 operates the robot body 4 to cause the wafer holding hand 5 to move up a little, and then operates the actuator 57 so that the chuck 56 moves from the retracted position to the holding position.

When the wafer holding hand 5 has moved up a little from the carry-out access position, the wafer 10 is placed on the wafer holding hand 5. In a state in which the wafer 10 is placed on the wafer holding hand 5, the edge of the wafer 10 is in linear or point contact with the tilted surfaces 521 of the two pads 52, 53 and the tilted surfaces 541 of the two guides 54. Then, the wafer 10 is positioned on the wafer holding hand 5 so that the primary surface of the wafer 10 becomes substantially horizontal by the slopes of the tilted surfaces 521, 541 and the weight of the wafer 10. In the wafer holding hand 5 on which the wafer 10 is placed, the chuck 56 is advanced from the retracted position toward the holding position toward the tip end side FF to push the wafer 10 toward the tip end side FF. The wafer 10 moves away from the tilted surfaces 541 of the two guides 54 and slides on the tilted surfaces 521 of the two pads 52, 53 until the wafer 10 contacts the vertical surfaces 522. Then, the edge of the wafer 10 contacts the vertical surface 562 of the chuck 56 and the vertical surfaces 522 of the two pads 52, 53 and are pushed by them. In this way, the wafer 10 is held by the wafer holding hand 5 (see FIG. 4).

After the wafer 10 is held by the wafer holding hand 5 in the above-described manner, the controller 6 outputs the control signals to the driving unit of the robot body 4 to cause the wafer holding hand 5 to exit the wafer container 2 (step S3). The wafer holding hand 5 holding the wafer 10 is drawn out of the wafer container 2 in a state in which the wafer holding hand 5 has a posture in which the reference plane RP is substantially horizontal. In this way, the wafer 10 is carried out of the wafer container 2.

Then, the controller 6 outputs the control signals to the driving unit of the robot body 4 to change the posture of the wafer holding hand 5 into a posture in which the reference plane RP is substantially vertical (step S4). Specifically, the controller 6 operates the robot body 4 so that the wafer holding hand 5 rotates about 90 degrees around the third axis 46 of the wrist 47 of the robot body 4.

Since the wrist 47 of the robot body 4 rotates about 90 degrees around the third axis 46, the wafer holding hand 5 changes its posture from the posture in which the reference plane RP is substantially horizontal to the posture in which the reference plane RP is substantially vertical. According to this change in the posture of the wafer holding hand 5, the wafer 10 restricted by the wafer holding hand 5 changes its posture from the horizontal posture (horizontally oriented state) to the vertical posture (vertically oriented state).

For easier understanding of the description, it is assumed that a region that is above a horizontal center line HC extending through the center O of the wafer 10 with the vertical posture is an upper side, a region that is below the horizontal center line HC is a lower side, a region that is on one side of a vertical center line VC extending through the center O of the wafer 10 with the vertical posture is a first side, and a region that is on the other side of the vertical center line VC is a second side. In the wafer holding hand 5 holding the wafer 10, the vertical surface of the upper pad 53 is in contact with the edge of the wafer 10 on the upper side and on the first side, the vertical surface 522 of the lower pad 52 is in contact with the edge of the wafer 10 on the lower side and on the first side, and the vertical surface 562 of the chuck 56 is in contact with the edge of the wafer 10 on the second side, and between the upper pad 53 and the lower pad 52. More specifically, the wafer 10 is pushed and supported on the wafer holding hand 5 at at least three support points located on the edge of the wafer 10, including an upper support point SP1 located on the edge of the wafer 10 that is on the upper side and on the first side, a lower support point SP2 located on the edge of the wafer 10 that is on the lower side and on the first side, and an intermediate support point SP3 located on the edge of the wafer 10 that is on the second side and between the upper support point SP1 and the lower support point SP2 in the vertical direction. The support point is defined to include a point or a collection (line) of continuous points.

Then, the controller 6 outputs the control signals to the driving unit of the robot body 4 to move the wafer holding hand 5 to a carry-in access position (step S5). Note that the movement of the wafer holding hand 5 to the carry-in access position, and the above-described posture change may be performed concurrently.

While the wafer holding hand 5 is moving toward the carry-in access position, the wafer holding hand 5 moves to a location that is in front of the wafer container 3 which can store therein the wafers 10 vertically placed, and then moves into a gap formed between the target groove 32 for vertically placing the wafer 10 therein, and the groove 32 which is adjacent to the target groove 32, to the carry-in access position. In a state in which the wafer holding hand 5 is at the carry-in access position, the wafer 10 held by the wafer holding hand 5 is located above the carry-in target groove 32 inside the wafer container 3. More specifically, the wafer 10 is aligned with the vertical groove 33 and the horizontal groove 34 of the carry-in target groove 32, in a plan view, and the edge of the wafer 10 is not fitted into the vertical groove 33 and the horizontal groove 34 yet, but is close to the vertical groove 33 and the horizontal groove 34.

At a time point when the wafer holding hand 5 reaches the carry-in access position $P_{in}$, the controller 6 outputs the control signal to the actuator 57 to cause the wafer holding hand 5 to cease to hold the wafer 10 (step S6). Specifically, the controller 6 operates the actuator 57 to retract the chuck 56 from the holding position to the holding ceasing position.

Figure 9:
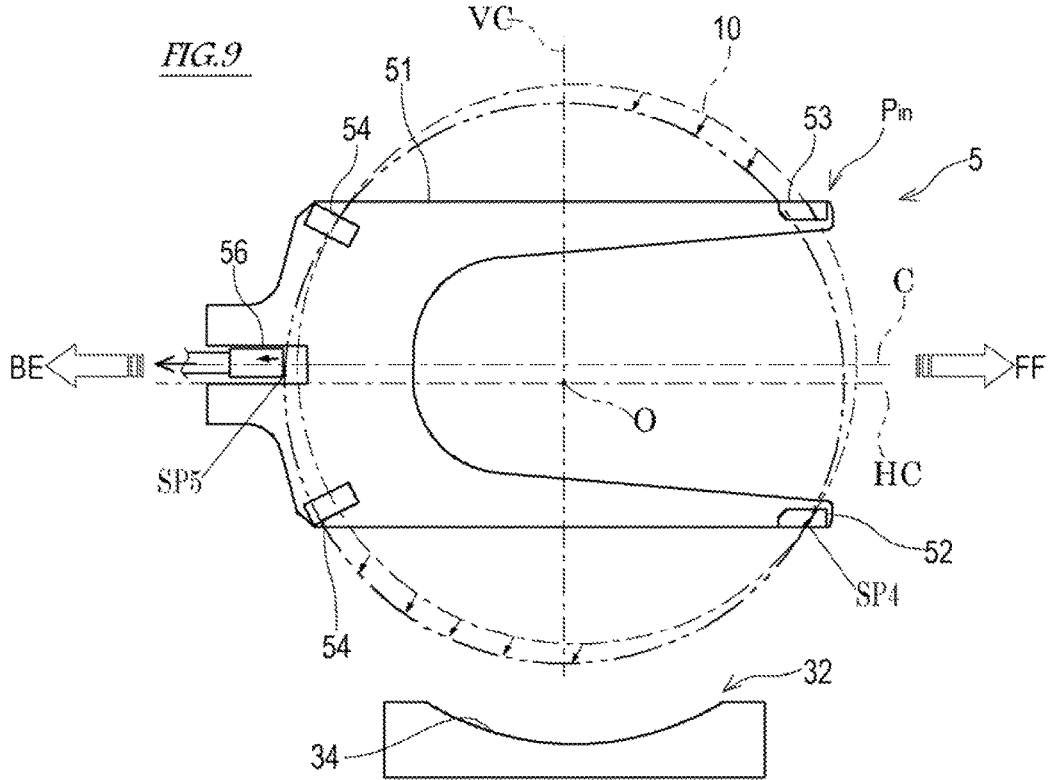
FIG. 9 is a view showing a wafer holding hand which ceases to hold the wafer at a carry-in access position.

When the chuck 56 has moved from the holding position to the holding ceasing position, the wafer 10 is released from the restriction by the wafer holding hand 5. FIG. 9 is a view showing the wafer holding hand 5 which has ceased to hold the wafer at the carry-in access position $P_{in}$. In FIG. 9, the wafer 10 held by the wafer holding hand 5 is indicated by a dot-and-dash-line, while the wafer 10 supported on the wafer holding hand 5 at two support points are indicated by a chain double-dashed line. As shown in FIG. 9, the wafer 10 which has been released from the restriction moves down by its weight toward the base end side BE relative to the wafer holding hand 5, according to the movement of the chuck 56 from the holding position to the holding ceasing position. As a result, the wafer 10 moves away from the upper pad 53, and is supported on the wafer holding hand 5 by the lower pad 52 and the chuck 56. More specifically, the wafer 10 is supported on the wafer holding hand 5 at two support points which are a lower support point SP4 located on the edge of the wafer 10 that is on the lower side and on the first side, and an upper support point SP5 located on the edge of the wafer 10 that is above the lower support point SP4 and on the second side. The lower support point SP4 may be the same as the lower support point SP2 or may partially overlap with the lower support point SP2. The upper support point SP5 may be the same as the intermediate support point SP3 or may partially overlap with the intermediate support point SP3.

The wafer 10 supported on the wafer holding hand 5 at the two support points is permitted to move in a direction (namely, vertical direction) which is substantially parallel to the reference plane RP. The wafer 10 supported on the wafer holding hand 5 at the two support points is permitted to move within a specified range (range within which the wafer 10 does not disengage from the wafer holding hand 5) in a direction (namely, horizontal direction) that is away from the reference plane RP. However, a movement of the wafer 10 which is outside the specified range is restricted by the flange 523 of the lower pad 52 and the flange 561 of the chuck 56.

In a state in which the wafer 10 is released from the restriction as described above, the controller 6 outputs the control signals to the driving unit of the robot body 4 to move the wafer holding hand 5 to a wafer set position $P_{set}$ (step S7). Specifically, the controller 6 operates the robot body 4 so that the wafer holding hand 5 moves down, because the wafer set position $P_{set}$ is immediately below the carry-in access position $P_{in}$.

Figure 10:
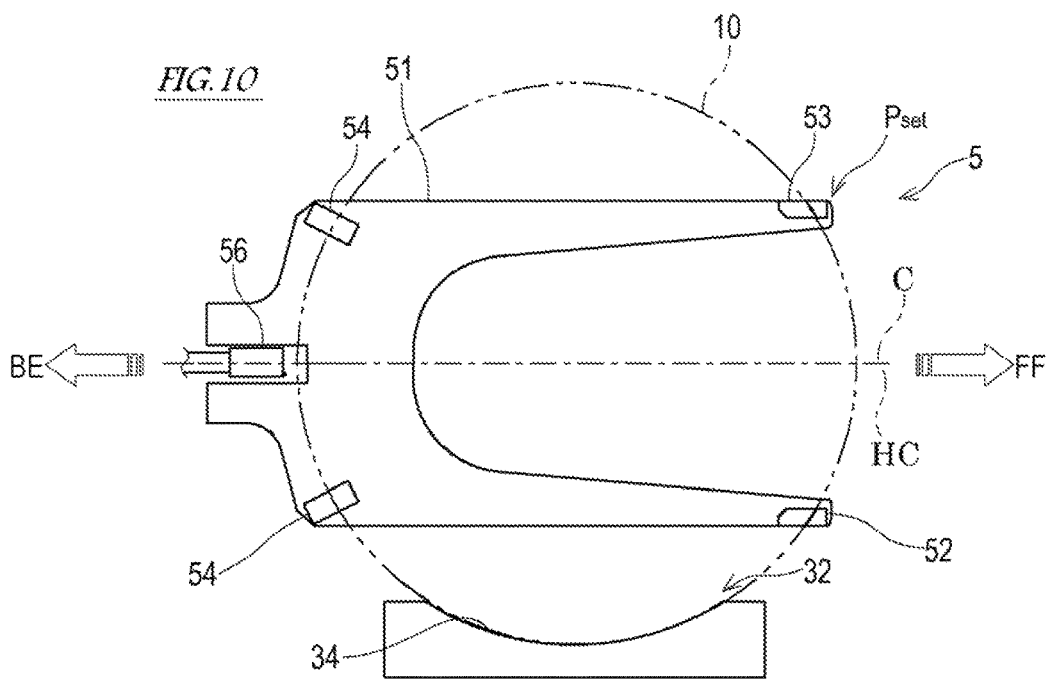
FIG. 10 is a view showing the wafer holding hand at a wafer set position.

FIG. 10 is a view showing the wafer holding hand 5 at the wafer set position $P_{set}$. As shown in FIG. 10, while the wafer holding hand 5 is moving from the carry-in access position $P_{in}$ to the wafer set position $P_{set}$, or at the wafer set position $P_{set}$, the edge of the wafer 10 moves into the vertical groove 33 and the horizontal groove 34 of the groove 32 for vertically placing the wafer 10 therein. The wafer 10 permitted to move reaches the bottom surface of the vertical groove 33 and the bottom surface of the horizontal groove 34, by its own weight, while being guided along the tilted surface of the vertical groove 33 and the tilted surface of the horizontal groove 34. In this way, the wafer 10 is placed in the groove 32. The movement operation of the wafer holding hand 5 from the carry-in access position $P_{in}$ to the wafer set position $P_{set}$ is the operation for placing the wafer 10 in the groove 32 for vertically placing the wafer 10 therein.

After the wafer 10 has been placed in the groove 32, the controller 6 outputs the control signals to the driving unit of the robot body 4 to cause the wafer holding hand 5 to exit the wafer container 3 (step S7). To cause the wafer holding hand 5 to exit the wafer container 3, the controller 6 slightly moves the wafer holding hand 5 toward the tip end side FF, then moves the wafer holding hand 5 in the direction that is perpendicular to the reference plane RP and away from the wafer 10, and then moves the wafer holding hand 5 in a direction in which the wafer holding hand 5 exits the wafer container 3.

Since the controller 6 slightly moves the wafer holding hand 5 toward the tip end side FF, interference between the flanges 523 of the two pads 52, 53 and the wafer 10 is ceased. Since the wafer holding hand 5 moves away from the wafer 10, the wafer 10 is released from the wafer holding hand 5. Since the wafer holding hand 5 moves in a direction in which the wafer holding hand 5 exits the wafer container 3, the wafer holding hand 5 exits the wafer container 3. By the above-described series of operations of step S1 to S8 which are performed by the wafer transfer device 1, the wafer 10 stored in the wafer container 2 which can store therein the wafers 10 horizontally placed is transferred to the groove 32 for vertically placing the wafer 10 therein, of the wafer container 3 which can store therein the wafers 10 vertically placed.

Next, the operation of the wafer transfer device 1 performed in a case where the wafer 10 stored in the wafer container 3 which can store therein the wafers 10 vertically placed is transferred to the groove 22 for horizontally placing the wafer 10 therein, of the wafer container 2 which can store therein the wafers 10 horizontally placed will be described.

Figure 11:
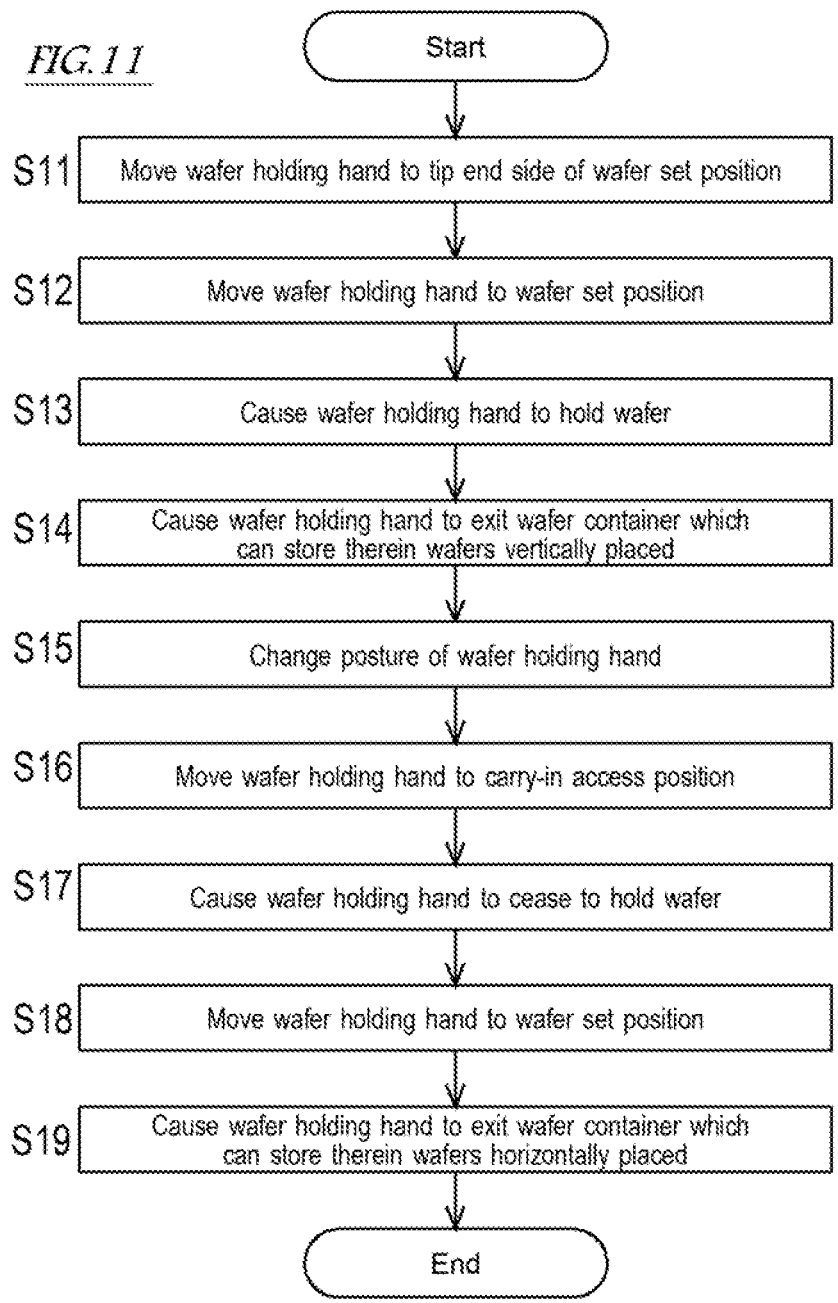
FIG. 11 is a flowchart showing a flow of a control of the wafer transfer device, which is performed when the wafer is transferred to a groove for horizontally placing the wafer therein.

FIG. 11 is a flowchart showing a flow of a control for the wafer transfer device 1, which is performed when the wafer 10 is transferred to the groove 22 for horizontally placing the wafer 10 therein. As shown in FIG. 11, initially, the controller 6 outputs the control signals to the driving unit of the robot body 4 to move the wafer holding hand 5 toward the tip end side FF of the wafer set position corresponding to the wafer 10 which is to be carried out of the wafer container 3 (carry-out target wafer 10) (step S11). Then, the controller 6 outputs the control signals to the driving unit of the robot body 4 to move the wafer holding hand 5 to the wafer set position (FIG. 10) (step S12). Then, the controller 6 outputs the control signal to the actuator 57 to cause the wafer holding hand 5 to hold the wafer 10 (step S13). Specifically, the controller 6 operates the actuator 57 to cause the chuck 56 to be advanced toward the holding position.

When the carry-out target wafer 10 is held by the wafer holding hand 5 through the above-described steps S11 to S13, the controller 6 outputs the control signals to the driving unit of the robot body 4 to cause the wafer holding hand 5 to exit the wafer container 3 (step S14). The wafer holding hand 5 slightly moves up to cause the edge of the wafer 10 to exit the groove 32, and then exits the wafer container 3.

After the wafer 10 has been carried out of the wafer container 3 as described above, the controller 6 outputs the control signals to the driving unit of the robot body 4 to change the posture of the wafer holding hand 5 from the posture in which the reference plane RP is substantially vertical to the posture in which the reference plane RP is substantially horizontal (step S15). According to this change in the posture of the wafer holding hand 5, the wafer 10 held by the wafer holding hand 5 changes its posture from the vertical posture (vertically oriented state) to the horizontal posture (horizontally oriented state). Then, the controller 6 outputs the control signals to the driving unit of the robot body 4 to move the wafer holding hand 5 to a carry-in access position (step S16). Note that the movement of the wafer holding hand 5 to the carry-in access position, and the above-described posture change may be performed concurrently. At the carry-in access position, the wafer 10 held by the wafer holding hand 5 is present just in front of the carry-in target groove 22 of the wafer container 2.

When the wafer holding hand 5 reaches the carry-in access position, the controller 6 outputs the control signal to the actuator 57 to cause the wafer holding hand 5 to cease to hold the wafer 10 (step S17). Alternatively, after the movement of the wafer holding hand 5 to the wafer set position which will be described later is completed, the wafer holding hand 5 may cease to hold the wafer 10. Then, the controller 6 outputs the control signals to the driving unit of the robot body 4 to move the wafer holding hand 5 to the wafer set position (step S18). While the wafer holding hand 5 is moving from the carry-in access position to the wafer set position, the wafer 10 supported on the wafer holding hand 5 moves into the carry-in target groove 22, then slightly moves down, and is placed in the groove 22. Finally, the controller 6 outputs the control signals to the driving unit of the robot body 4 to cause the wafer holding hand 5 to exit the wafer container 2 (step S19).

As described above, the series of operations performed by the wafer transfer device 1 of the present embodiment to transfer the wafer 10 to the groove 32 for vertically placing the wafer 10 therein, include the operation for causing the wafer holding hand 5 to hold the wafer 10 at at least three support points on the edge of the wafer 10, the operation for moving the wafer holding hand 5 to cause the wafer 10 with the vertical posture (in the vertically oriented state) to be positioned above the groove 32 for vertically placing the wafer 10 therein (namely, at the carry-in access position), the operation for causing the wafer holding hand 5 to cease to hold the wafer 10 and support the wafer 10 at two support points on the edge of the wafer 10, and the operation for moving the wafer holding hand 5 downward to the position (namely, the wafer set position) at which the edge of the wafer 10 moves into the groove 32.

To be precise, the operation for causing the wafer holding hand 5 to hold the wafer 10 at at least three support points on the edge of the wafer 10 includes the operation for advancing the chuck 56 (intermediate movable pad) to the holding position to cause the wafer 10 to be held by the upper pad 53, the lower pad 52, and the chuck 56. Also, the operation for causing the wafer holding hand 5 to cease to hold the wafer 10 and support the wafer 10 at two support points on the edge of the wafer 10 includes the operation for causing the chuck 56 to be retracted to the holding ceasing position to cause the wafer 10 to be supported by the lower pad 52 and the chuck 56 (intermediate movable pad).

As described above, a method of transferring the wafer 10 to the groove 32 for vertically placing the wafer 10 therein, by use of the wafer transfer device 1 of the present embodiment, includes causing the wafer holding hand 5 to hold the wafer 10 at at least three support points on the edge of the wafer 10, moving the wafer holding hand 5 holding the wafer 10 to cause the wafer 10 with the vertical posture (in the vertically oriented state) to be positioned above the groove 32 (namely, at the carry-in access position $P_{in}$), causing the wafer holding hand 5 to cease to hold the wafer 10 and support the wafer 10 at two support points on the edge of the wafer 10, and moving the wafer holding hand 5 downward to the position (namely, the wafer set position $P_{set}$) at which the edge of the wafer 10 moves into the groove 32.

In the above-described method, in the state in which the wafer 10 is supported at two support points on the edge of the wafer 10, the upper support point SP5 of the wafer 10 is located above the lower support point SP4 of the wafer 10, and is desirably located at the center of gravity of the wafer 10 or above the center of gravity (in other words, at the horizontal center line HC or above the horizontal center line HC). A support element (the lower pad 52 in the present embodiment) constituting the lower support point SP4 is desirably provided with the flange 523 for preventing disengagement of the wafer 10. A support element (the chuck 56 in the present embodiment) constituting the upper support point SP5 is desirably provided with the flange 561 for preventing disengagement of the wafer 10. This allows the wafer 10 to be stably supported at two support points on the wafer holding hand 5.

In accordance with the wafer transfer device and the wafer transfer method as described above, while the wafer 10 is transferred to the position (namely, the carry-in access position) that is above the groove 32 for vertically placing the wafer 10 therein, the wafer 10 with the vertical posture (in the vertically oriented state) is supported at at least three support points on the wafer holding hand 5. Therefore, the wafer 10 can be stably transferred to the groove 32. When the wafer 10 is placed in the groove 32 for vertically placing the wafer 10 therein, the wafer 10 is supported at two support points on the wafer holding hand 5 and permitted to move with respect to the wafer holding hand 5. When the edge of the wafer 10 moves into the groove 32, the wafer 10 moves by itself to the bottom of the groove 32 while preventing a situation in which the wafer 10 strongly contacts the inner wall of the groove 32 or other regions, or a strong friction between the wafer 10 and the inner wall of the groove 32 or other regions occurs, and thus the wafer 10 is placed in the groove 32. In brief, even in a case where there is an error between the target position at which the wafer 10 is to be placed, and the position of the groove 32, this error is absorbed by the movement of the wafer 10 with respect to the wafer holding hand 5.

As described above, since the error between the target position at which the wafer 10 is to be placed, and the position of the groove 32 is absorbed by the movement of the wafer 10 with respect to the wafer holding hand 5, teaching of the target position at which the wafer 10 is to be placed does not require a very high accuracy. The wafer container 3 which can store therein the wafers 10 vertically placed is provided with the plurality of grooves 32 for vertically placing the wafers 10 therein. For example, if the wafer set positions and carry-in access positions corresponding to two grooves 32 at outermost sides and desirably the groove 32 at a center, among the plurality of grooves 32, are taught to the robot body 4, then the wafer set positions and carry-in access positions corresponding to the remaining grooves 32 can be derived by the calculation, during execution of the transfer program.

Thus far, the preferred embodiment of the present invention has been described. The above-described configuration may be changed as follows.

Figure 12:
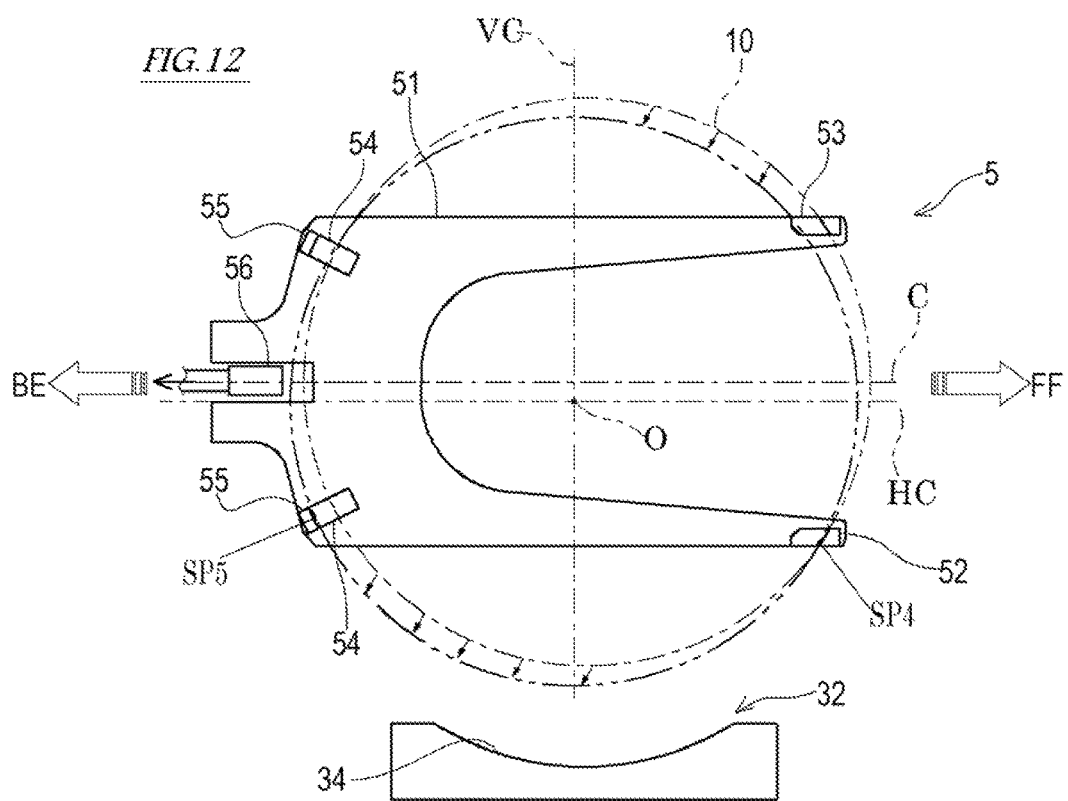
FIG. 12 is a view showing a modified example of the wafer holding hand.

In the above-described embodiment, after the wafer holding hand 5 ceases to hold the wafer 10, the wafer 10 is supported on the wafer holding hand 5 by the lower pad 52 and the chuck 56. Alternatively, to support the wafer 10 after the wafer holding hand 5 ceases to hold the wafer 10, the wafer holding hand 5 may be provided with fixed pads (intermediate fixed pads 55) instead of the movable chuck 56. For example, as shown in FIG. 12, the intermediate fixed pads 55 are provided to contact the edge of the wafer 10 at the base end side BE, at locations between the lower pad 52 and the upper pad 53. This intermediate fixed pads 55 may be integrated with the guides 54.

In a case where the intermediate fixed pads 55 are provided as described above, the chuck 56 (intermediate movable pad) is retracted from the edge of the wafer 10 in a step (step S6) in which the controller 6 outputs the control signal to the actuator 57 to cause the wafer holding hand 5 to cease to hold the wafer 10. Thus, the wafer 10 is supported on the wafer holding hand 5 by the lower pad 52 and the intermediate fixed pads 55.

REFERENCE SIGNS LIST

1 wafer transfer device
2 wafer container which stores therein wafers horizontally placed
21 shell
22 groove for horizontally placing a wafer therein
3 wafer container which stores therein wafers vertically placed
31 shell
32 groove for vertically placing a wafer therein
33 vertical groove
34 horizontal groove
4 robot body
40 base member
41 up-down shaft
42 first axis
43 first arm
44 second axis
45 second arm
46 third axis
47 wrist
48 fourth axis
49 hand base section
5 wafer holding hand
51 base plate
52 lower pad
521 tilted surface
522 vertical surface
523 flange
53 upper pad
54 guide
541 tilted surface
55 intermediate fixed pad
56 chuck (intermediate movable pad)
561 flange
562 vertical surface
57 actuator
6 controller
61 to 65 servo motor
10 wafer

The invention claimed is:

1. A wafer transfer method which transfers a wafer with a disc shape to a groove for vertically placing the wafer therein, by use of a wafer holding hand, the wafer transfer method comprising:

causing the wafer holding hand to hold the wafer at at least three support points on an edge of the wafer;
moving the wafer holding hand holding the wafer to cause the wafer with a vertical posture in which the wafer is vertically oriented to be positioned above the groove for vertically placing the wafer therein;
causing the wafer holding hand to cease to hold the wafer and to support the wafer at two support points on the wedge of the wafer; and
moving the wafer holding hand supporting the wafer downward until the edge of the wafer moves into the groove for vertically placing the wafer therein.

2. The wafer transfer method according to claim 1,
wherein in a case where a region that is above a horizontal center line extending through a center of the wafer with the vertical posture is an upper side, a region that is below the horizontal center line is a lower side, a region that is on one side of a vertical center line extending through the center of the wafer with the vertical posture is a first side, and a region that is on the other side of the vertical center line is a second side,
the at least three support points at which the wafer is held by the wafer holding hand include:
an upper support point located on the edge of the wafer that is on the first side and on the upper side;
a lower support point located on the edge of the wafer that is on the first side and on the lower side; and
an intermediate support point located on the edge of the wafer that is on the second side and between the upper support point and the lower support point in a vertical direction.

3. The wafer transfer method according to claim 2,
wherein the two support points at which the wafer is supported on the wafer holding hand includes:
the lower support point located on the edge of the wafer that is on the first side and on the lower side; and
an upper support point located on the wedge of the wafer that is on the second side and above the lower support point.

4. The wafer transfer method according to claim 2,
wherein the wafer held by the wafer holding hand has a horizontal posture in which the wafer is horizontally oriented, and
wherein moving the wafer holding hand holding the wafer includes rotating the waver holding hand to cause the wafer to have the vertical posture.

5. The wafer transfer method according to claim 1,
wherein the wafer held by the wafer holding hand has a horizontal posture in which the wafer is horizontally oriented, and
wherein moving the wafer holding hand holding the wafer includes rotating the waver holding hand to cause the wafer to have the vertical posture.

6. A wafer transfer method which transfers a wafer to a groove for vertically placing the wafer therein, by use of a wafer holding hand including an upper pad, a lower pad, and an intermediate movable pad,
wherein in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, the upper pad is configured to contact the edge of the wafer that is on the first side and on the upper side, the lower pad is configured to contact the edge of the wafer that is on the first side and on the lower side, and the intermediate movable pad is configured to contact the edge of the wafer that is on the second side and between the upper pad and the lower pad in a vertical direction, the wafer transfer method comprising:

causing the wafer holding hand to hold the wafer by the upper pad, the lower pad, and the intermediate movable pad;

moving the wafer holding hand holding the wafer to cause the wafer with the vertical posture to be positioned above the groove for vertically placing the wafer therein;

causing the intermediate movable pad of the wafer holding hand to be retracted from the edge of the wafer to support the wafer by the lower pad and the intermediate movable pad of the wafer holding hand; and moving the wafer holding hand supporting the wafer downward until the edge of the wafer moves into the groove for vertically placing the wafer therein.

7. A wafer transfer method which transfers a wafer to a groove for vertically placing the wafer therein, by use of a wafer holding hand including an upper pad, a lower pad, an intermediate fixed pad, and an intermediate movable pad, wherein in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, the upper pad is configured to contact the edge of the wafer that is on the first side and on the upper side, the lower pad is configured to contact the edge of the wafer that is on the first side and on the lower side, the intermediate fixed pad is configured to contact the edge of the wafer that is on the second side and between the upper pad and the lower pad in a vertical direction, and the intermediate movable pad is configured to contact the edge of the wafer that is on the second side and between the upper pad and the lower pad in the vertical direction, the wafer transfer method comprising:

causing the wafer holding hand to hold the wafer by the upper pad, the lower pad, and the intermediate movable pad;

moving the wafer holding hand holding the wafer to cause the wafer with the vertical posture to be positioned above the groove for vertically placing the wafer therein;

causing the intermediate movable pad of the wafer holding hand to be retracted from the edge of the wafer to support the wafer by the lower pad and the intermediate fixed pad of the wafer holding hand; and moving the wafer holding hand supporting the wafer downward until the edge of the wafer moves into the groove for vertically placing the wafer therein.

8. A wafer transfer device which transfers a wafer with a disc shape to a groove for vertically placing the wafer therein, the wafer transfer device comprising:

in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, a wafer holding hand including an upper pad configured to contact the edge of the wafer that is on the first side and on the upper side; a lower pad configured to contact the edge of the wafer that is on the first side and on the lower side; an intermediate movable pad configured to contact the edge of the wafer that is on the second side and between the upper pad and the lower pad in a vertical direction; and an actuator which advances the intermediate movable pad toward the wafer and retracts the intermediate movable pad from the wafer;

a robot body on which the wafer holding hand is attached; and a controller which controls the robot body and the actuator to perform:

an operation for advancing the intermediate movable pad of the wafer holding hand to cause the wafer holding hand to hold the wafer by the upper pad, the lower pad, and the intermediate movable pad, an operation for moving the wafer holding hand holding the wafer to cause the wafer with the vertical posture to be positioned above the groove for vertically placing the wafer therein, an operation for causing the intermediate movable pad of the wafer holding hand to be retracted from the edge of the wafer to support the wafer by the lower pad and the intermediate movable pad of the wafer holding hand, and an operation for moving the wafer holding hand supporting the wafer downward until the edge of the wafer moves into the groove for vertically placing the wafer therein.

9. A wafer transfer device which transfers a wafer with a disc shape to a groove for vertically placing the wafer therein, the wafer transfer device comprising:

in a case where a region that is above a horizontal center line extending through a center of the wafer with a vertical posture in which the wafer is vertically oriented is an upper side, a region that is below the horizontal center line is a lower side, a region that is on one side of a vertical center line extending through the center of the wafer with the vertical posture is a first side, and a region that is on the other side of the vertical center line is a second side, a wafer holding hand including an upper pad configured to contact the edge of the wafer that is on the first side and on the upper side; a lower pad configured to contact the edge of the wafer that is on the first side and on the lower side; an intermediate fixed pad configured to contact the edge of the wafer that is on the second side and between the upper pad and the lower pad in a vertical direction, an intermediate movable pad configured to contact the edge of the wafer that is on the second side and between the upper pad and the lower pad in the vertical direction; and an actuator which advances the intermediate movable pad toward the wafer and retracts the intermediate movable pad from the wafer;

a robot body on which the wafer holding hand is attached; and a controller which controls the robot body and the actuator to perform:

an operation for advancing the intermediate movable pad of the wafer holding hand to cause the wafer holding hand to hold the wafer by the upper pad, the lower pad, and the intermediate movable pad, an operation for moving the wafer holding hand holding the wafer to cause the wafer with the vertical posture to be positioned above the groove for vertically placing the wafer therein, an operation for causing the intermediate movable pad of the wafer holding hand to be retracted from the edge of the wafer to support the wafer by the lower pad and the intermediate fixed pad of the wafer holding hand, and an operation for moving the wafer holding hand supporting the wafer downward until the edge of the wafer moves into the groove for vertically placing the wafer therein.

* * * * *